United States Patent [19]

Henderson et al.

[11] 4,054,860
[45] Oct. 18, 1977

[54] HALL EFFECT ROTARY SWITCH

[75] Inventors: Donald Max Henderson, Crystal Lake; Raymond F. Lewandowski, Mount Prospect, both of Ill.

[73] Assignee: Oak Industries Inc., Crystal Lake, Ill.

[21] Appl. No.: 636,800

[22] Filed: Dec. 1, 1975

[51] Int. Cl.² .................................. H01L 43/04
[52] U.S. Cl. ........................... 338/32 H; 200/291
[58] Field of Search ............... 338/32 H, 32 R; 323/94 H; 324/45, 46; 340/204, 365 L, 347 P; 200/291; 335/1, 2, 205–207

[56] References Cited

U.S. PATENT DOCUMENTS

| 3,185,920 | 5/1965 | Brunner | 338/32 H X |
| 3,317,829 | 5/1967 | Kuhrt et al. | 324/45 X |
| 3,499,133 | 3/1970 | Tillack et al. | 200/291 X |
| 3,671,874 | 6/1972 | Kobayashi | 338/32 H X |
| 3,818,326 | 6/1974 | Masuda et al. | 324/45 X |
| 3,891,143 | 6/1975 | Haeusler | 340/347 M X |

*Primary Examiner*—C. L. Albritton
*Attorney, Agent, or Firm*—Kinzer, Plyer, Dorn & McEachran

[57] ABSTRACT

A Hall effect rotary switch includes a stator and a rotor. The stator mounts a row of spaced Hall effect sensing circuits. There are magnetic means for causing activation of the sensing circuits, with the rotor selectively positioning said magnetic means adjacent said Hall effect sensing circuits to provide coded outputs therefrom at different positions of the rotor.

18 Claims, 9 Drawing Figures

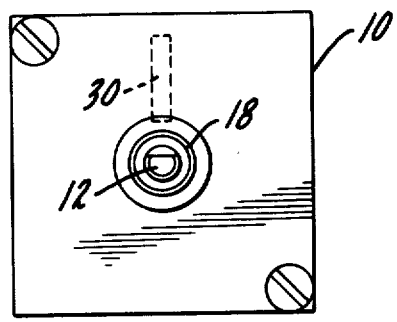
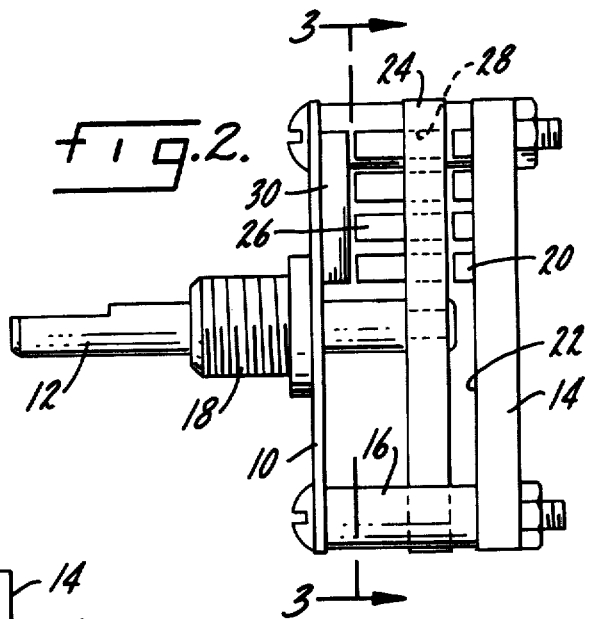
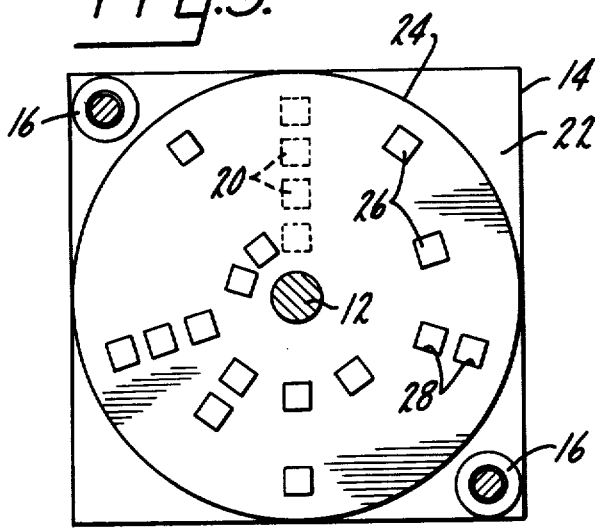
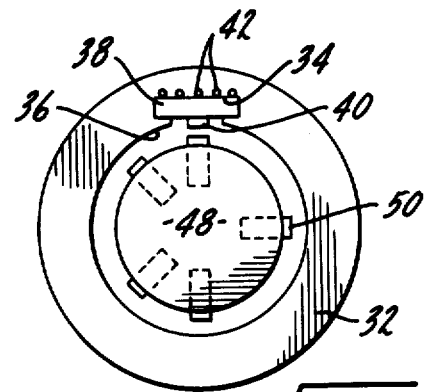
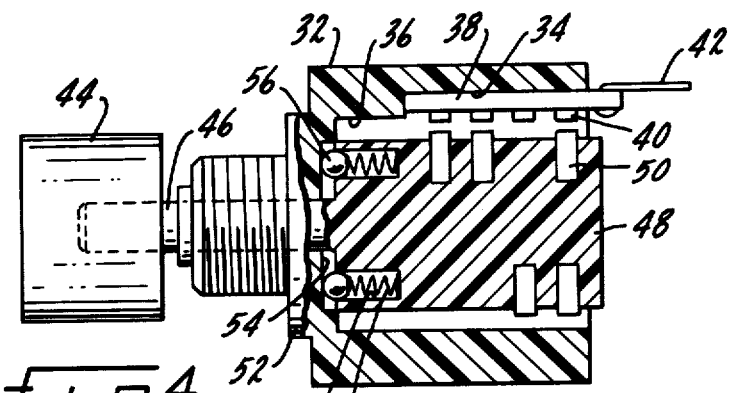
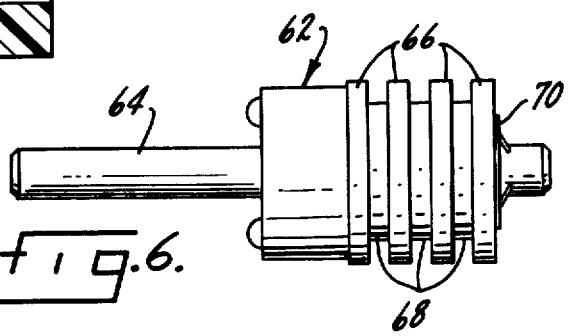

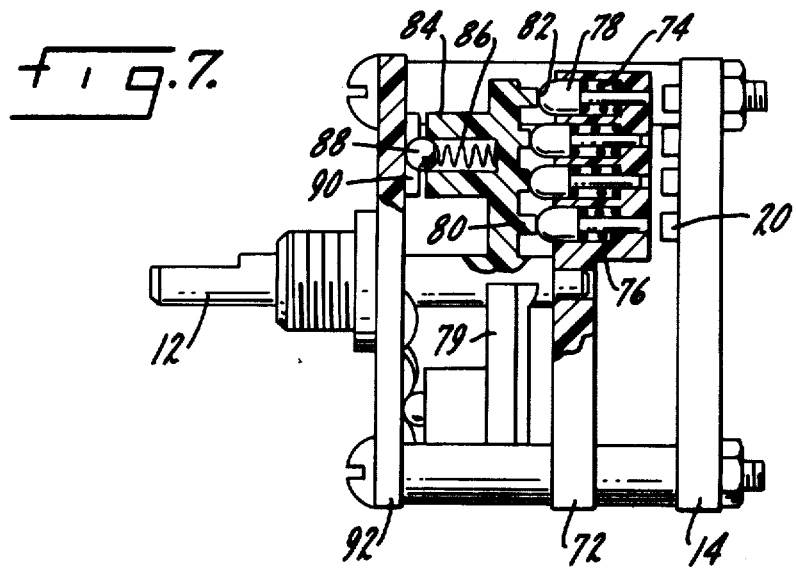
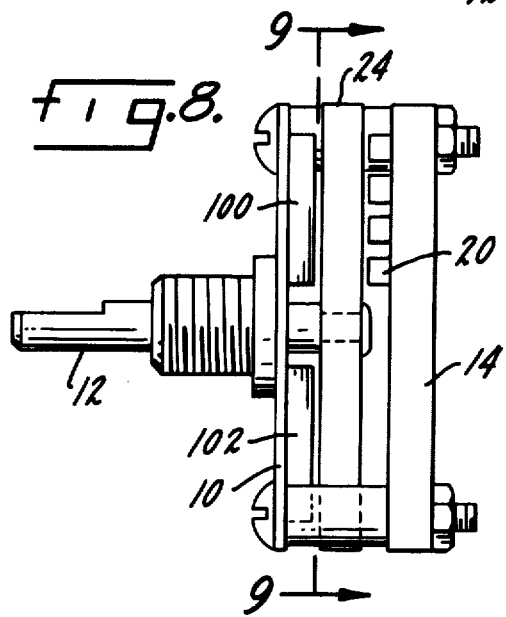
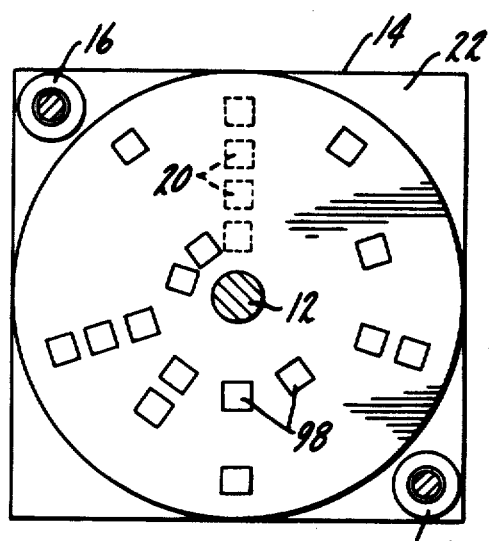

4,054,860

HALL EFFECT ROTARY SWITCH

SUMMARY OF THE INVENTION

The present invention relates to a Hall effect rotary switch providing a coded output indicative of switch position.

A primary purpose of the invention is a contactless rotary switch.

Another purpose is a rotary switch of the type described in which permanent magnets are arranged in a coded pattern on a rotary device which is movable relative to a stator mounting a series of Hall effect sensing circuits.

Another purpose is a rotary switch in which a rotor carrying a plurality of magnets arranged in a coded pattern rotates in a plane parallel to a stator mounting a row of Hall effect sensing circuits.

Another purpose is a rotary switch of the type described in which the rotor is in the form of a cylinder rotating within the stator and carrying magnets arranged in a coded pattern about its periphery.

Another purpose is a rotary switch of the type described including detent means for providing a number of fixed rotor positions.

Another purpose is a rotary Hall effect switch in which a series of magnets are arranged opposite a row of Hall effect sensing circuits, with the rotor carrying a plurality of cam tracks which are used to selectively move the magnets toward the Hall effect sensing circuits for providing coded outputs therefrom.

Another purpose is a simply constructed reliably operable Hall effect rotary switch which can provide a binary coded output for varying numbers of switch positions.

Another purpose is a switch construction of the type described which does not react adversely to dust, dirt, moisture, cleaning agents and the like and has an extremely long life.

Another purpose is a Hall effect rotary switch having no mechanical wear.

Other purposes will appear in the ensuing specification, drawings and claims.

BRIEF DESCRIPTION OF THE DRAWINGS

The invention is illustrated diagrammatically in the following drawings wherein:

FIG. 1 is a plan view of a portion of a switch housing,
FIG. 2 is a side view of the switch of FIG. 1,
FIG. 3 is a section along plane 3—3 of FIG. 2,
FIG. 4 is an axial section through a modified form of Hall effect rotary switch,
FIG. 5 is an end view of FIG. 4,
FIG. 6 is a side view of a further modified form of Hall effect rotary switch,
FIG. 7 is a side view, in partial section, of a further form of rotary switch,
FIG. 8 is a side view, similar to FIG. 2, showing a further form of the invention, and
FIG. 9 is a section along plane 9'9 of FIG. 8.

DESCRIPTION OF THE PREFERRED EMBODIMENT

The present invention utilizes Hall effect sensing circuits in which the presence of an adjacent magnetic field is effective to provide an output current from the sensing circuit. The particular type of Hall effect sensing circuit may vary, although the ULN-3019 manufactured by Sprague Electric Company has been found to be satisfactory for purposes of the present structure. This particular semiconductor chip includes a voltage regulator, a Hall effect sensor, a Schmitt trigger circuit, and an output amplifier. The Hall effect sensing circuits are arranged so as to provide a coded output indicative of the position of a switch rotor relative to its stator, thus providing a contactless rotary switch. The output may be in a binary code or one of the other commonly used electronic codes. The switch rotor carries a plurality of magnets arranged in rows which move to a position directly opposite the row of Hall effect sensors. The number and disposition of magnets in a particular row determine which Hall effect sensors are activated and thus the coded number for a particular switch position.

In FIG. 1, a switch housing plate is indicated generally at 10 and mounts a rotary shaft 12. The switch stator is indicated generally at 14 and may be suitably connected to the housing or cover plate 10 through a plurality of spacing members 16. A typical threaded bushing 18 partially encloses shaft 12 and is used to mount the switch to an instrument panel or the like.

Stator 14 may mount a group of Hall effect sensing circuits indicated at 20. These may be semiconductor chips of the type described above and the number of such chips and their disposition will depend on the desired coded output. The chips may be attached to face 22 of stator 14 and there will be suitable electric output terminals or connections from the chips.

Attached to shaft 12 is a rotor 24 which will mount individual permanent magnets 26 in the openings indicated at 28 in FIG. 3. Assuming that the coded output is to be in binary form, and with four Hall effect chips 20 positioned in a row as shown in FIGS. 2 and 3, there will be a row of openings and thus permanent magnets along ten different radii of rotor 24. The rows will be arranged in a conventional binary form, i.e., no magnets for row 0, one magnet for row 1, one magnet for row 2, etc. When a particular row, on a particular radii, is positioned in alignment with the row of four Hall effect chips 20, those ships having a magnet positioned adjacent to them will be activated in the well known manner to provide an output current. Thus, position of the rotary switch is readily determined by the output of the Hall effect sensing circuits. This output may be used to provide a visual indication of switch position or it may be used as an operating current or a switch closing signal, much in the manner of a conventional rotary switch. Although in the above-described example there are ten rows of openings 28 and permanent magnets 26 on ten different radii, it should be understood that it is not necessary in every application to have openings and magnets for each radii or row. Thus, as is conventional in normal switching operations, some positions of the switch may have no output.

In order to provide fixed rotor positions, a detent arrangement is illustrated in FIGS. 1 and 2. A permanent detent magnet 30 is attached to the inside of cover plate 10 in direct alignment with Hall effect chips 20. Thus, the attracting magnetic fields of detent magnet 30 and actuating magnets 26 will be effective to hold the rotor 24 in a particular switch position. Although only one detent magnet is shown in the drawings, it should be understood that in some applications it may be desirable to have a greater number of such detent magnets, up to the number of rows, so as to provide a stronger magnetic force of attraction between the rotor and the stator and thus a more positive detent holding force.

In the construction of FIGS. 4 and 5, the stator is cylindrical in form and is indicated at 32. There may be a groove 34 formed on inside surface 36 of the stator and a small substrate 38 mounting four Hall effect chips 40 is inserted and secured within the groove. The substrate 38 may have a plurality of output terminals 42, as particularly illustrated in FIG. 5. A conventional rotor knob 44 is attached to a rotor shaft 46 with the shaft in turn mounting a cylindrical rotor 48. Rotor 48 may have a plurality of actuating magnets 50 arranged in a series of peripherally or circumferentially spaced rows. Again, the number of rows may vary. The structure of FIGS. 4 and 5 provides eight such rows, with the number of magnets 50 in each row being determined by the particular number assigned to the row. Thus, at different positions of rotor 48 there will be different binary outputs from the series of Hall effect chips 40.

Stator 32 includes a cover 52 having a series of indentations 54, there being one such indentation for each position of the rotor. A pair of balls 56 are mounted at the end of bores 58, each of which contain springs 60. Springs 60 bias balls 56 into the indentation or grooves 54 to provide a conventional mechanical detent arrangement for the switch.

In the structure of FIG. 6, rotor 48 with its peripherally arranged rows of magnets 50, has been replaced by a rotor 62 having a shaft 64 mounting a plurality, in this case four, magnetic discs 66 spaced apart by non-magnetic spacer members 68. A retainer 70 is used to hold the assembly together. Each of the discs 68 will have defined magnetic areas on their periphery, with the areas being arranged in a suitable coded pattern so as to interact with Hall effect chips 40, illustrated in FIG. 4, to provide a coded output from the chips. The particular type of code again will vary, although a binary coded output has been found to be satisfactory. In other respects the structure of FIG. 6 is similar to the structure of FIGS. 4 and 5.

In the construction of FIG. 7, parts similar to or identical with those in FIGS. 1, 2 and 3 have been given like numbers. The stator in the construction of FIG. 7 includes a fixed plate 72 containing a row of bores 74, each of which contain a coil spring 76. Permanent magnets 78 each having stems extending toward Hall effect chips 20 are positioned within the bores. Springs 76 urge magnets 78 outwardly from the bores and away from the Hall effect chips 20 mounted on stator 14. The rotor includes a cam plate 79, attached to shaft 12, and having four cam tracks 80, Each of the cam tracks will have cam areas, such as indicated at 82, which extend toward the magnets 78. Thus, as rotor 12 rotates relative to the stator, the cam tracks 80 and the cam areas 82 will selectively move the magnets inwardly in bores 74 to a position sufficiently close to the Hall effect chips to provide the necessary magnetic field for actuation thereof. The particular arrangement of cam areas 82 will again provide a coded output from the Hall effect chips. There is a cam track for each of permanent magnets 78 and the number of and spacing of and position of cam areas 82 will be dependent upon the desired coded output.

The rotor also includes a pair of cylindrical projections 84 mounting springs 86 and balls 88 which are urged into indentations 90 on housing plate 92. This combination of elements again provides a positive mechanical detent arrangement for the switch of FIG. 7.

FIGS. 8 and 9 show a structure similar to that of FIGS. 1, 2 and 3, but with the individual magnets 26 replaced by magnetic areas. Like parts have identical numbers. Rotor 24 has radial rows of defined magnetic areas 98 arranged in the same pattern as shown in FIG. 3. Opposite poles of the magnetic areas will be located at the opposite surfaces of the rotor.

Detent magnets 100 and 102 are located on the inside surface of cover plate 10 180° apart. One of the detent magnets is again positioned directly over Hall effect chips 20.

All of the switches operate in essentially the same manner, as there is an electrical output indicative of switch position, thus providing a contactless switch. The output signal, which may be a binay code or otherwise, may be used in the same manner as a conventional switch output signal. There may be an output signal from every position of the switch or from less than all positions of the switch. There may be a positive mechanical detent such as shown in FIGS. 4 and 7, or there may be a magnetic detent such as shown in FIGS. 2 and 8. In the structures of FIGS. 1 through 6, 8 and 9, the rotor carries the magnetic means or magnetic devices for actuating the Hall effect sensing circuits. In the structure of FIG. 7, the magnets are permanently located and their position relative to the Hall effect chips is varied by cam tracks on the rotor.

Although in all of the structures shown there are a given number of Hall effect sensing circuits, sufficient to provide a coded output, and these sensing circuits are permanently located, with a variable number of magnets moving into a proximity relationship with the Hall effect sensing circuits, the relationship could be reversed. In some applications the magnets may be permanently located on the stator and the Hall effect chips on the rotor may be moved relative to the stator magnets, again with the result that the Hall effect chips will provide an output current indicative of switch position.

Whereas the preferred form of the invention has been shown and described herein, it should be realized that there may be many modifications, substitutions and alterations thereto.

The embodiments of the invention in which an exclusive property or privilege is claimed are defined as follows:

1. A Hall effect rotary switching device including a stator mounting a plurality of spaced Hall effect sensing circuits, magnetic means for causing activation of said Hall effect sensing circuits, a rotor rotatable adjacent said stator for selectively positioning said magnetic means adjacent said Hall effect sensing circuits to provide position indicating outputs therefrom, and cooperating magnetic indexing means on said rotor and stator for providing a plurality of fixed rotor positions.

2. The structure of claim 1 further characterized in that said magnetic means are mounted on said rotor and rotatable therewith.

3. The structure of claim 2 further characterized in that said Hall effect sensing circuits are arranged in a radial row from the axis of rotation of said rotor, said magnetic means including a plurality of magnets arranged in a coded pattern in radial rows about the axis of rotation of said rotor.

4. The structure of claim 3 further characterized in that said magnets are arranged in radial rows to provide a binary number output from said Hall effect sensing circuits at each position of said rotor.

5. The structure of claim 4 further characterized in that said indexing means includes a detent magnet carried by said stator in alignment with said Hall effect sensing circuits.

6. The structure of claim 2 further characterized in that said rotor is generally cylindrical in form and rotates within said stator, said magnetic means including a plurality of magnets carried by said rotor and positioned about the periphery thereof.

7. The structure of claim 6 further characterized in that said magnets are arranged in a plurality of circumferentially spaced rows, with the magnets in each row being arranged to provide a different coded output from said Hall effect sensing circuits at different positions of said rotor.

8. The structure of claim 7 further characterized in that said rows of magnets are arranged to provide binary outputs from said Hall effect sensing circuits.

9. The structure of claim 2 further characterized in that said rotor is generally cylindrical in form and rotates within said stator, with said magnetic means being positioned about the periphery of said rotor.

10. The structure of claim 9 further characterized in that said rotor includes a plurality of spaced discs, there being the same number of discs as there are Hall effect sensing circuits, defined peripheral spaces of said discs having magnetic areas thereon.

11. The structure of claim 10 further characterized in that said disc magnetic areas are coded to provide a binary output from said Hall effect sensing circuits.

12. The structure of claim 9 further characterized by and including cooperating detent means on said rotor and stator.

13. The structure of claim 1 further characterized in that said magnetic means includes a row of magnets mounted on said stator, there being an equal number of magnets and spaced Hall effect sensing circuits, said magnets being positioned opposite said sensing circuits, and means carried by said rotor for causing selective movement of said magnets toward said sensing circuits.

14. The structure of claim 13 further characterized by and including a plurality of circumferential cam tracks carried by said rotor and positioned to cause selective movement of said magnets toward said Hall effect sensing circuits.

15. The structure of claim 14 further characterized by and including means for biasing said magnets away from said Hall effect sensing circuits, with said cam tracks selectively causing movement of said magnets, against said biasing means, toward said sensing circuits.

16. The structure of claim 15 further characterized in that there is a cam track for each magnet, with each cam track having cam portions thereon positioned to cause selective movement of said magnets toward said Hall effect sensing circuits.

17. The structure of claim 1 further characterized in that said magnetic indexing means includes a plurality of magnets carried by said stator.

18. The structure of claim 2 further characterized in that said Hall effect sensing circuits are arranged in a radial row from the axis of rotation of said rotor, said magnetic means including a plurality of magnetic areas arranged in a coded pattern in radial rows.

* * * * *